US011385632B2

(12) United States Patent
Whitehead et al.

(10) Patent No.: US 11,385,632 B2
(45) Date of Patent: Jul. 12, 2022

(54) SENSOR FAULT DETECTION AND IDENTIFICATION USING RESIDUAL FAILURE PATTERN RECOGNITION

(71) Applicant: The Boeing Company, Chicago, IL (US)

(72) Inventors: Brian T. Whitehead, Renton, WA (US); Sherwin C. Li, Edmonds, WA (US); Brian K. Rupnik, Lake Stevens, WA (US); Kioumars Najmabadi, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 782 days.

(21) Appl. No.: 16/230,938

(22) Filed: Dec. 21, 2018

(65) Prior Publication Data

US 2020/0201312 A1 Jun. 25, 2020

(51) Int. Cl.
*G01C 21/16* (2006.01)
*G05B 23/02* (2006.01)
*G01R 19/00* (2006.01)
*G05D 1/00* (2006.01)

(52) U.S. Cl.
CPC ..... *G05B 23/0275* (2013.01); *G01R 19/0038* (2013.01); *G05D 1/0055* (2013.01)

(58) Field of Classification Search
CPC ............ G05B 23/0275; G01R 19/0038; G05D 1/0055
See application file for complete search history.

(56) References Cited

U.S. PATENT DOCUMENTS

| 8,204,635 | B2 * | 6/2012 | Manfred | G01C 23/00 |
| | | | | 701/4 |
| 9,128,109 | B1 * | 9/2015 | O'Neill | G01P 21/02 |
| 9,213,323 | B2 * | 12/2015 | Wang | G05B 13/024 |
| 9,266,626 | B2 * | 2/2016 | Cheriere | G06F 11/079 |

(Continued)

FOREIGN PATENT DOCUMENTS

| FR | 2857447 A1 * | 1/2005 | ............... G01D 3/08 |
| WO | WO-2019071327 A1 * | 4/2019 | ............. G01C 23/00 |

OTHER PUBLICATIONS

Collinson R P G: "Fly-By-Wire Flight Control", Computing and Control Engineering, IET Publishing Group, Stevenage, United Kingdom, vol. 10, No. 4, pp. 141-152, Aug. 1999.

*Primary Examiner* — Redhwan K Mawari
(74) *Attorney, Agent, or Firm* — Haynes and Boone, LLP

(57) ABSTRACT

Systems, methods, and apparatus for sensor fault detection and identification using residual failure pattern recognition are disclosed. In one or more embodiments, a method for sensor fault detection and identification for a vehicle comprises sensing, with sensors located on the vehicle, data. The method further comprises performing majority voting on the data for each of the types of data to generate a single voted value for each of the types of data. Also, the method comprises generating, for each of the types of data, estimated values by using some of the voted values. In addition, the method comprises generating residuals by comparing the estimated values to the voted values. Further, the method comprises analyzing a pattern of the residuals to determine which of the types of the data is erroneous to detect and identify a fault experienced by at least one of the sensors on the vehicle.

17 Claims, 16 Drawing Sheets

(56) References Cited

U.S. PATENT DOCUMENTS

| | | | |
|---|---|---|---|
| 9,933,451 B2* | 4/2018 | Dupont De Dinechin | B64F 5/60 |
| 10,053,079 B2* | 8/2018 | Brockmann | B60T 8/885 |
| 10,338,585 B2* | 7/2019 | Burte | B64C 13/505 |
| 2006/0235599 A1* | 10/2006 | Mukherjee | G05B 23/0254 701/31.4 |
| 2011/0040430 A1* | 2/2011 | Tessier | G05D 1/0077 701/3 |
| 2018/0340795 A1* | 11/2018 | Goupil | G05B 17/02 |

* cited by examiner

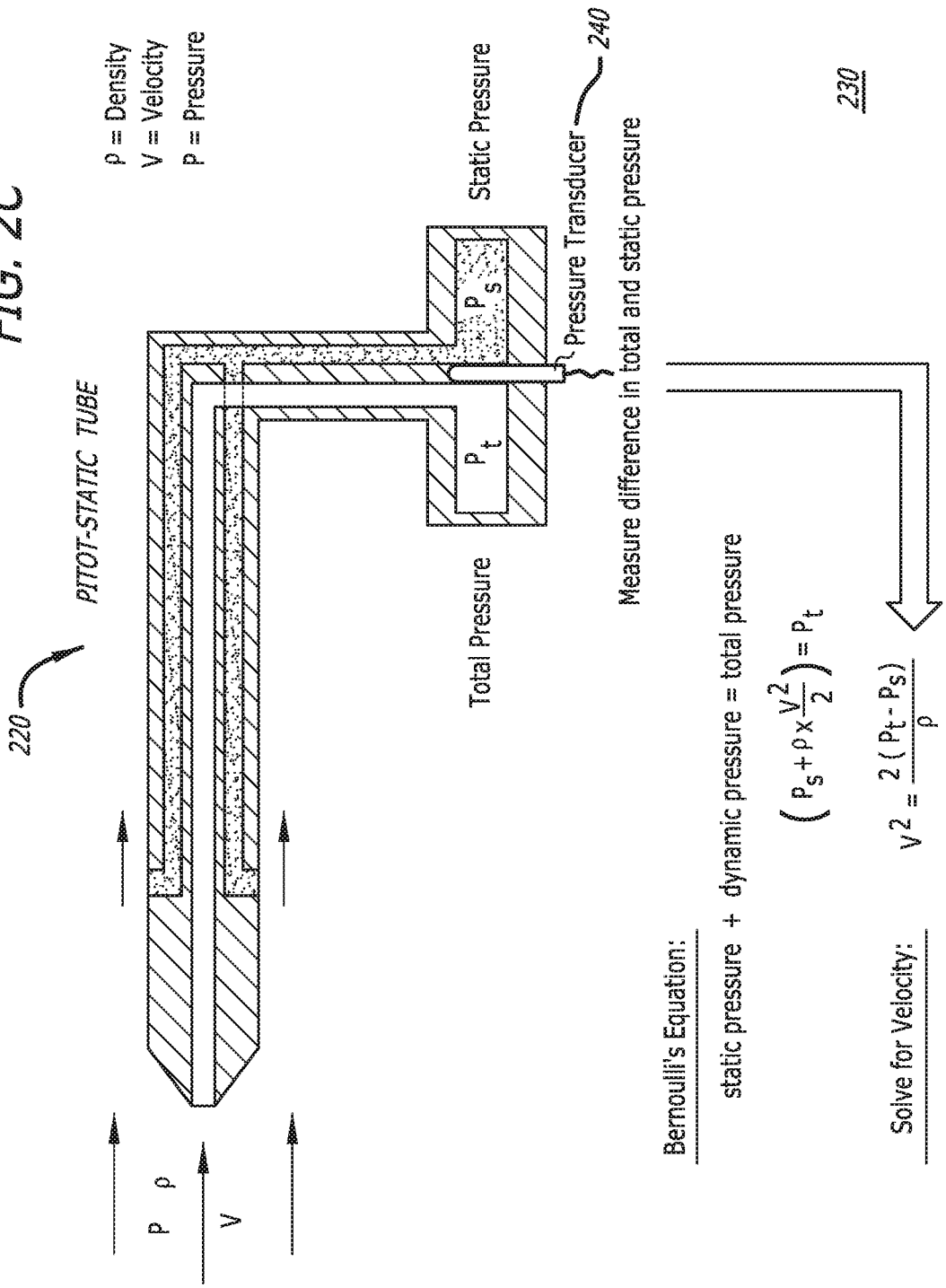

$$x = \begin{bmatrix} P_t \\ P_s \\ \alpha \end{bmatrix} \in \mathbb{R}^n \quad n=3$$

$$y = \begin{bmatrix} P_t \\ P_s \\ \alpha \\ A_N \end{bmatrix} \in \mathbb{R}^m \quad m=4$$

$$\hat{y}_1 = f_1(P_S, \alpha, A_N)$$
$$\hat{y}_2 = f_2(P_T, \alpha, A_N)$$
$$\hat{y}_3 = f_3(P_T, P_S, A_N)$$
$$\hat{y}_4 = f_4(P_T, P_S, \alpha)$$

Each estimator depends on m-1 measurements

*FIG. 5*

$\hat{y}_1 = f_1(P_S, \alpha, A_N)$   f1 will be unaffected by CMPE effect on PT $\hat{y}_2 = f_2(P_T, \alpha, A_N)$ $\hat{y}_3 = f_3(P_T, P_S, A_N)$ $\hat{y}_4 = f_4(P_T, P_S, \alpha)$ Fault detection logic:

Declare PT failed IFF:
- Residuals of f1 are small: $|r_{1,P_S}| < T$ & $|r_{1,\alpha}| < T$ & $|r_{1,A_N}| < T$
  AND
- Residuals of PT for others are large: $|r_{2,P_T}| \geq T$ & $|r_{3,P_T}| \geq T$ & $|r_{4,P_T}| \geq T$

FIG. 8

Expected Pattern of Residuals

| | f1=f2=f3=0 | f1≠0,f2=0,f3=0 | f1=0,f2≠0,f3=0 | f1=0,f2=0,f3≠0 |
|---|---|---|---|---|
| r 1,1 | 0 | ≠0 | ≠0 | ≠0 |
| r 1,2 | 0 | 0 | ≠0 | ≠0 |
| r 1,3 | 0 | 0 | ≠0 | ≠0 |
| r 2,1 | 0 | ≠0 | 0 | ≠0 |
| r 2,2 | 0 | ≠0 | 0 | ≠0 |
| r 2,3 | 0 | ≠0 | ≠0 | ≠0 |
| r 3,1 | 0 | ≠0 | ≠0 | 0 |
| r 3,2 | 0 | ≠0 | ≠0 | 0 |
| r 3,3 | 0 | ≠0 | ≠0 | ≠0 |

SENSOR FAULT DETECTION AND IDENTIFICATION USING RESIDUAL FAILURE PATTERN RECOGNITION

FIELD

The present disclosure relates to sensor fault detection and identification. In particular, the present disclosure relates to sensor fault detection and identification using residual failure pattern recognition.

BACKGROUND

Currently, aircraft pitot tubes are prone to measurement failure due to icing blockage, heavy water ingestion, volcanic ash blockage, etc. A common mode pneumatic event (CMPE) occurs when a majority of the pitot tubes on the airplane are blocked simultaneously. When a CMPE occurs, the display airspeed, which is displayed on the cockpit display, will be corrupted. In addition, the aircraft flight control system, which has a certain window of time of exposure to the corrupted airspeed, may cause the airplane to deviate from its optimal flight path.

In light of the foregoing, there is a need for an improved technology for sensor fault detection and identification of sensor measurement failures (e.g., airspeed, angle of attack, acceleration, etc.) on aircraft.

SUMMARY

The present disclosure relates to a method, system, and apparatus for sensor fault detection and identification using residual failure pattern recognition. In one or more embodiments, a method for sensor fault detection and identification for a vehicle comprises sensing, with sensors located on the vehicle, data. In one or more embodiments, the data comprises m number types of data. In at least one embodiment, m is an integer greater than two. The method further comprises performing, by at least one processor, majority voting on the data for each of the types of data to generate a single voted value for each of the types of data. Also, the method comprises generating, by at least one processor, for each of the types of data, estimated values by using at least some of the voted values. In some embodiments, m number of estimated values are generated by using n number of the voted values, where n is equal to m minus one. In addition, the method comprises generating, by at least one processor, residuals by comparing the estimated values to the voted values. Further, the method comprises analyzing, by at least one processor, a pattern of the residuals to determine which of the types of the data is erroneous to detect and identify a fault experienced by at least one of the sensors on the vehicle.

In one or more embodiments, the data comprises measurement data. In at least one embodiment, the sensors comprise at least two (2) of: a pitot tube, a pitot-static tube, a static port, a static tube, an angle of attack (AOA) resolver, or an accelerometer. In some embodiments, the types of data comprise at least three (3) of: total pressure, static pressure, angle of attack (AOA), or acceleration.

In at least one embodiment, the vehicle is an airborne vehicle, a terrestrial vehicle, or a marine vehicle. In some embodiments, the airborne vehicle is an airplane, an unmanned aerial vehicle (UAV), or a helicopter.

In one or more embodiments, the method further comprises removing, by at least one processor, known corruption effects from at least some of the data. In some embodiments, the known corruption effects are removed by at least one processor by utilizing dynamic pressure, Mach number, angle of attack (AOA), flap position, gear position, excess thrust, and/or ground effect terms.

In at least one embodiment, at least one processor generates the estimated values by utilizing at least one statistical filter. In some embodiments, at least one statistical filter is an extended Kalman filter (EKF).

In one or more embodiments, the method further comprises generating, by at least one processor, an alert signal indicating which of the types of data is erroneous and/or which type of the sensors are experiencing a failure. In some embodiments, the method further comprises generating a visual alert and/or an audible alert based on information contained in the alert signal.

In at least one embodiment, the method further comprises generating, by at least one processor, a synthetic data signal indicating to use synthetic data instead of erroneous sensed data.

In at least one embodiment, a system for sensor fault detection and identification for a vehicle comprises sensors, located on the vehicle, to sense data. In one or more embodiments, the data comprises m number types of data. In some embodiments, m is an integer greater than two. The system further comprises at least one processor configured to perform majority voting on the data for each of the types of data to generate a single voted value for each of the types of data; to generate for each of the types of data, m number of estimated values by using n number of the voted values, where n is equal to m minus one; to generate residuals by comparing the estimated values to the voted values; and to analyze a pattern of the residuals to determine which of the types of the data is erroneous to detect and identify a fault experienced by at least one of the sensors on the vehicle.

In one or more embodiments, at least one processor is further configured to remove known corruption effects from at least some of the data. In at least one embodiment, at least one processor is further configured to generate the estimated values by utilizing at least one statistical filter. In some embodiments, at least one statistical filter is an extended Kalman filter (EKF). In one or more embodiments, at least on processor is further configured to generate an alert signal indicating which of the types of data is erroneous and/or which type of the sensors are experiencing a failure.

In at least one embodiment, the system further comprises: at least one indicator light to generate a visual alert based on information contained in the alert signal, at least one display to display a visual display alert based on the information contained in the alert signal, and/or at least one speaker to generate an audio alert based on the information contained in the alert signal.

In one or more embodiments, at least one processor is further configured to generate a synthetic data signal indicating to use synthetic data instead of erroneous sensed data.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 2C is a diagram showing an exemplary pitot-static tube that may be employed for one of the sensors of the disclosed system for sensor fault detection and identification for a vehicle, in accordance with at least one embodiment of the present disclosure.

FIG. 5 shows equations for generating the estimated values utilized by the disclosed system for sensor fault detection and identification for a vehicle, in accordance with at least one embodiment of the present disclosure.

FIG. 8 shows equations for the fault detection logic utilized by the disclosed system for sensor fault detection and identification for a vehicle, in accordance with at least one embodiment of the present disclosure.

FIG. 10 is a chart showing an exemplary expected pattern of residuals utilized by the disclosed system for sensor fault detection and identification for a vehicle, in accordance with at least one embodiment of the present disclosure.

Figure 11A:
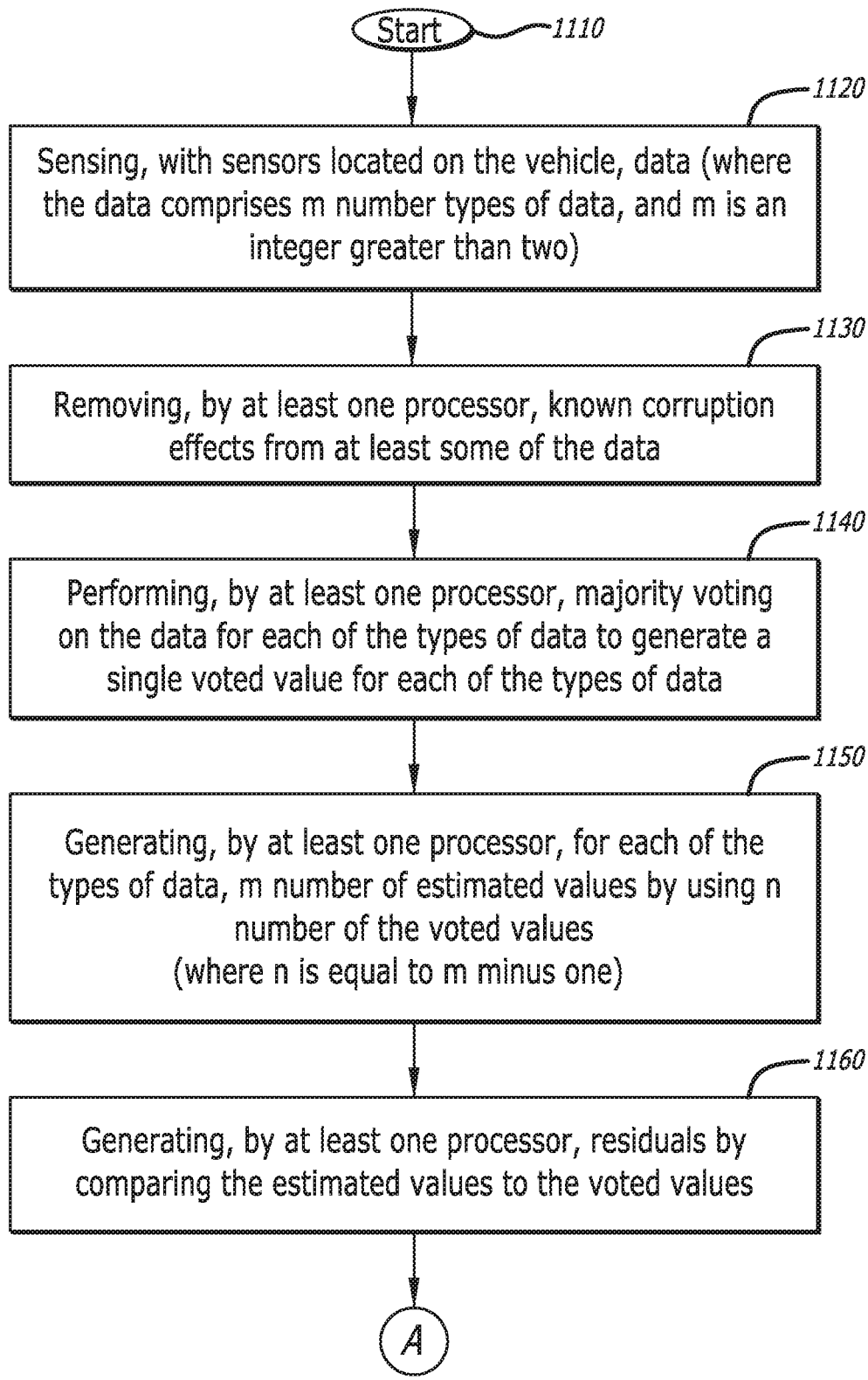
Figure 11B:
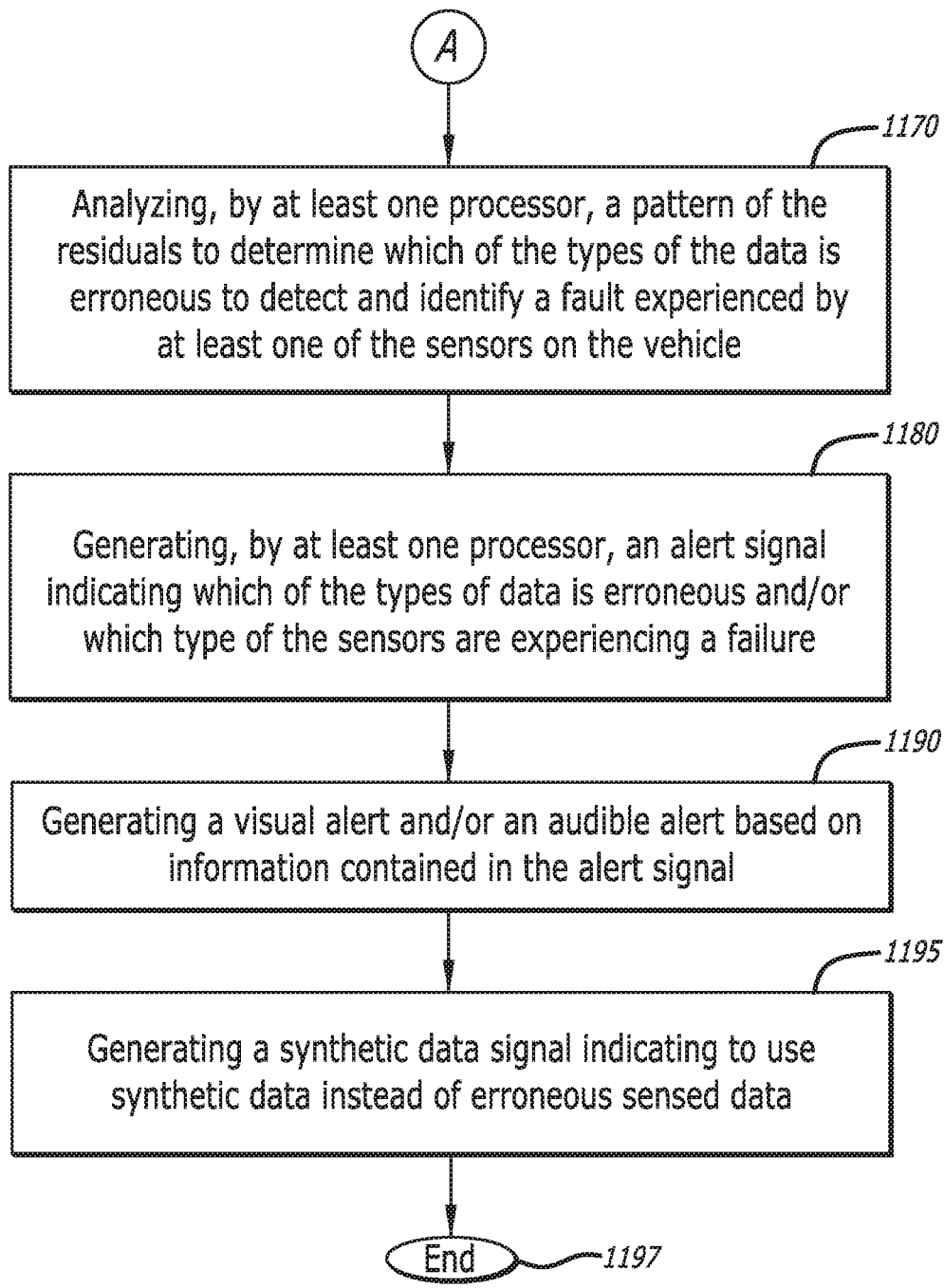

FIGS. 11A and 11B together form a flow chart showing the disclosed method for sensor fault detection and identification for a vehicle, in accordance with at least one embodiment of the present disclosure.

DESCRIPTION

The methods and apparatus disclosed herein provide an operative system for sensor fault detection and identification using residual failure pattern recognition. In one or more embodiments, the system of the present disclosure allows for sensor fault detection and identification by detecting erroneous sensor measurement data (e.g., total pressure, static pressure, angle of attack (AOA), and acceleration) produced by failed sensors (e.g., pitot tubes, static ports, AOA resolvers, and accelerometers) on the vehicle (e.g., aircraft).

In particular, the system of the present disclosure provides multi-sensor fault detection and identification by using a statistical filter (e.g., an extended Kalman filter (EKF)) architecture. Specifically, an array of statistical filters (e.g., extended Kalman filters (EKFs)) is utilized to compute different synthetic parameters (e.g., estimated values) for sensor health monitoring. In addition, the system leverages a pattern of residual characteristics (e.g., residuals) to identify which type of sensor (e.g., pitot tube, static port, AOA resolver, or accelerometer) failure has occurred on the vehicle in real-time.

The system of the present disclosure possesses a number of benefits. Firstly, the system has the ability to directly monitor the total pressure ($P_T$) and static pressure ($P_S$) sensor measurements by using the statistical filters' (e.g., EKFs') synthetic total pressure ($P_T$) and static pressure ($P_S$). Secondly, the system is able to provide a timely sensor failure detection that allows for the aircraft flight control system to provide an accurate, reliable flight deck engine-indicating and crew-alert system (EICAS) warning message to the pilots about which failure in the system has occurred and to discourage the pilots from performing an aggressive airplane maneuver. And, thirdly, the system is able to provide an accurate sensor failure identification that allows for the aircraft flight control system to continue operation by switching over to use the synthetic version of the erroneous measurement.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to sensors, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

In various embodiments, the disclosed system for sensor fault detection and identification is employed in an airplane. It should be noted that the disclosed system for sensor fault detection and identification may be employed by other vehicles other than an airplane as disclosed herein. The following discussion is thus directed to airplanes without loss of generality.

Figure 1A:
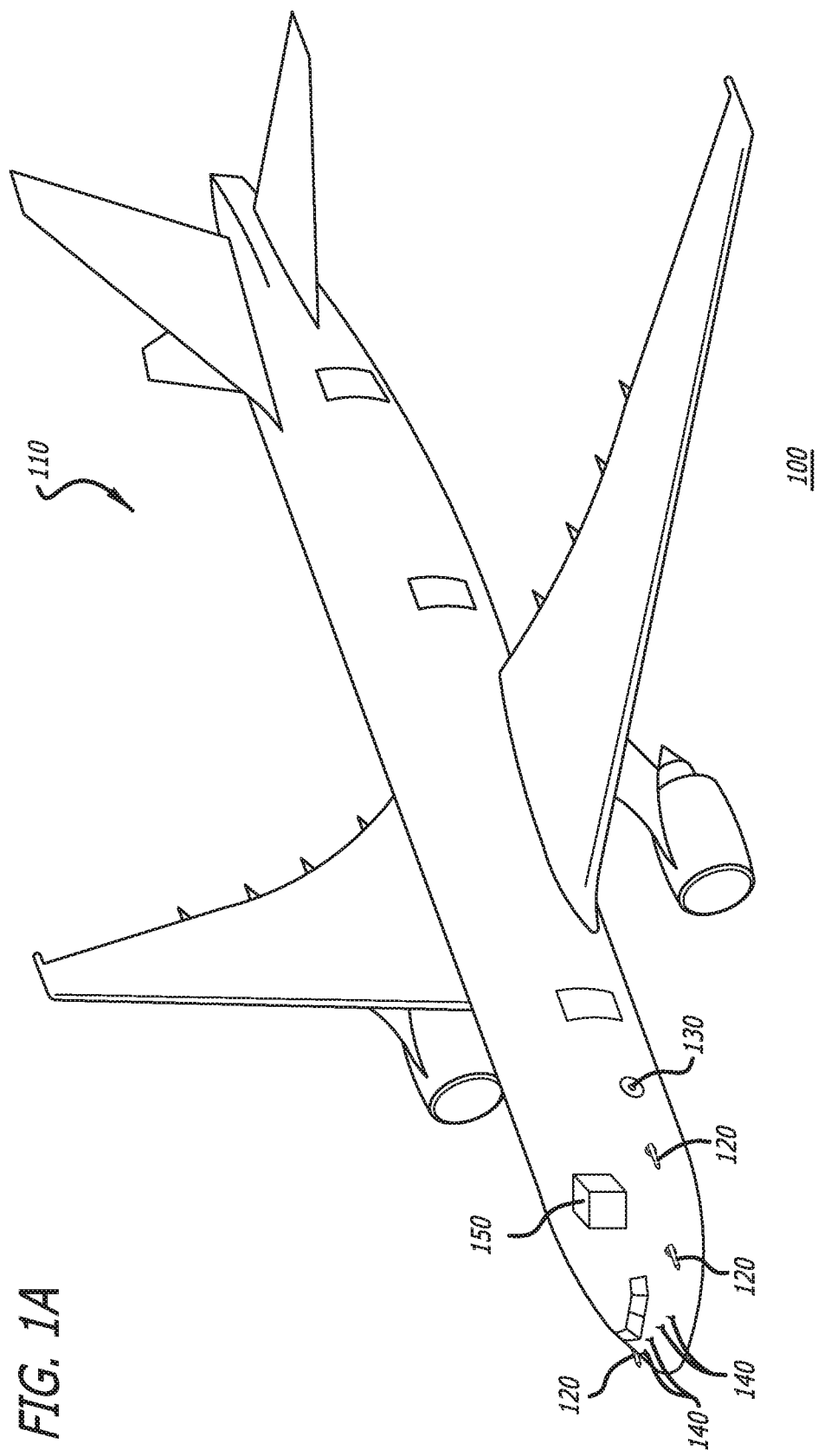
FIG. 1A is a diagram showing a vehicle (e.g., an airplane) that may be employed by the disclosed system for sensor fault detection and identification for a vehicle, where the vehicle is shown to comprise various different types of sensors, in accordance with at least one embodiment of the present disclosure.

FIG. 1A is a diagram 100 showing a vehicle (e.g., an airplane) 110 that may be employed by the disclosed system for sensor fault detection and identification for a vehicle 110, where the vehicle 110 is shown to comprise various different types of sensors, in accordance with at least one embodiment of the present disclosure. In this figure, the vehicle 110 is shown to be an airplane. However, in other embodiments, various different types of vehicles may be employed for the vehicle 110 of the disclosed system. In one or more embodiments, the disclosed system may employ an airborne vehicle, a terrestrial vehicle, or a marine vehicle for the vehicle 110. In one or more embodiments, various different types of airborne vehicles may be employed for the vehicle 110 including, but not limited to, an airplane (as shown in FIG. 1A), an unmanned aerial vehicle (UAV), or a helicopter.

Also in this figure, the vehicle 110 is shown to comprise a number of different types of sensors. These sensors include pitot tubes 120, a static port 130, angle of attack (AOA) resolvers 140, and an accelerometer 150. It should be noted that the pitot tubes 120, static port 130, and AOA revolvers 140 are located on the surface of the vehicle (e.g., airplane) 110, and the accelerometer 150 is located internal to the vehicle (e.g., airplane) 110. These sensors sense different types of measurement data. For example, the pitot tubes 120 sense total pressure ($P_T$), the static port 130 senses static pressure ($P_S$), the AOA resolvers 140 sense AOA ($\alpha$), and the accelerometer 150 senses acceleration ($A_N$).

In addition, it should be noted that, in one or more embodiments, the vehicle 110 may comprise more or less than the number of sensors as shown. For example, the vehicle 110 is shown to comprise three pitot tubes 120. In other embodiments, the vehicle 110 may comprise more or less pitot tubes 120 than three pitot tubes 120 as is shown in FIG. 1A.

Additionally, it should be noted that the vehicle 110 may comprise different types of sensors than the sensors as shown. As such, it should be understood that the types of sensors shown in FIG. 1A are merely example types of sensors that may be employed by the disclosed system. It follows that when utilizing different types of sensors, different types of sensor measurement data will be sensed. The disclosed system may operate utilizing different types of sensor measurement data than the types of sensor measurement data discussed herein.

Figure 1B:
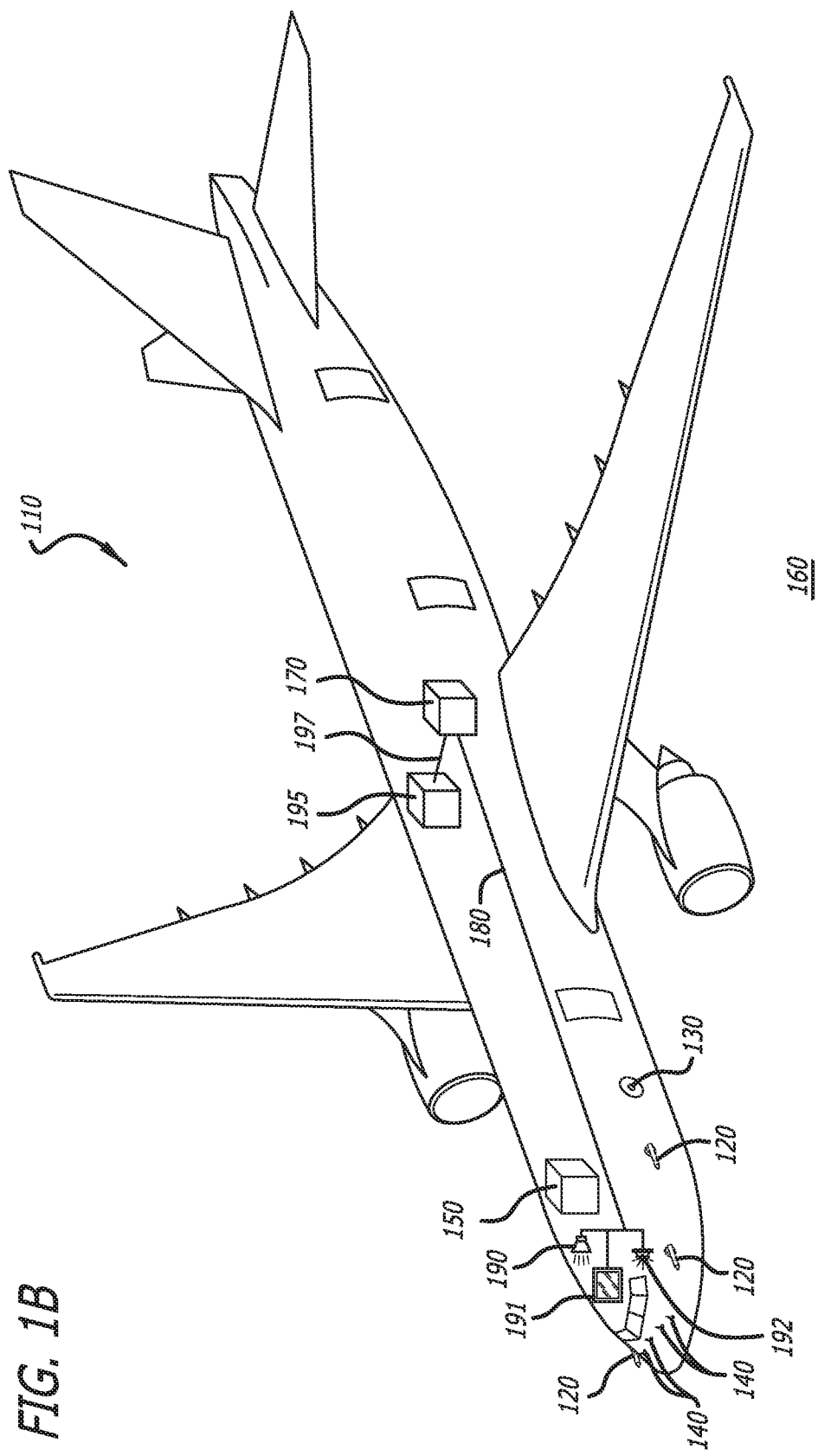
FIG. 1B is a diagram showing a vehicle (e.g., an airplane) that may be employed by the disclosed system for sensor fault detection and identification for a vehicle, where the vehicle is shown to comprise a plurality of units utilized for generating an alert, in accordance with at least one embodiment of the present disclosure.

FIG. 1B is a diagram 160 showing a vehicle (e.g., an airplane) 110 that may be employed by the disclosed system for sensor fault detection and identification for a vehicle 110, where the vehicle 110 is shown to comprise a plurality of units utilized for generating an alert, in accordance with at least one embodiment of the present disclosure. In this figure, the vehicle 110 is shown to additionally comprise a processor(s) 170 connected via wire 180 to a speaker 190, a display 191, and an indicator light 192. The processor(s) 170 may be located within the electronics area (e.g., electronics bay) of the vehicle (e.g., airplane) 110; and the speaker 190, display (e.g., a display screen) 191, and indicator light 192 may be located within the driver's (e.g., pilot's) area (e.g., cockpit) of the vehicle 110.

The vehicle 110 is also shown to additionally comprise a flight control system 195. The flight control system 195 may be located within the electronics area (e.g., electronics bay) of the vehicle (e.g., airplane) 110. The flight control system 195 is connected to the processor(s) 170 via wire 197.

It should be noted that in other embodiments, the processor(s) 170 may be connected to the speaker 190, the display 191, and the indicator light 192 wirelessly. In addition, in other embodiments, the vehicle 110 may comprise more than one processor(s) 170, more than one speaker 190, more than one display 191, and/or more than one indicator light 192 as is shown. Also, it should be noted that the sensors (e.g., pitot tubes 120, a static port 130, angle of attack (AOA) resolvers 140, and an accelerometer 150) may be connected to the processor(s) 170 via wire and/or wirelessly.

During operation of the disclosed system, while the vehicle is operating, the processor(s) 170 receives data (e.g., sensor measurement data) from the different types of sensors (e.g., pitot tubes 120, a static port 130, angle of attack (AOA) resolvers 140, and an accelerometer 150) on the vehicle 110. The processor(s) 170 analyzes the data and determines whether one of the types of data (e.g., total pressure ($P_T$), static pressure ($P_S$), AOA ($\alpha$), or the acceleration ($A_N$)) measured is erroneous. If the processor(s) 170 determines that one of the types of data is erroneous, meaning the erroneous data's associated sensor has failed, the processor(s) 170 generates an alert signal to alert the driver (e.g., pilot) of the erroneous sensor measurement data and/or sensor failure. The alert signal indicates which type of data is erroneous (e.g., total pressure ($P_T$) measured data is erroneous) and/or indicates which type of the sensors is experiencing a failure (e.g., the pitot tubes 120 are experiencing a failure (e.g., from being blocked by icing)).

After the processor(s) 170 has generated an alert signal, the processor(s) 170 transmits the alert signal via wire 180 (or wirelessly) to the speaker 190, the display 191, and/or the indicator light 192. In one or more embodiments, once the speaker 190 receives the alert signal, the speaker 190 will produce an audio alert, which may be an alarm tone and/or a verbal alert message describing the specific type of erroneous data and/or the specific type of sensor that has failed. In some embodiments, when the display 191 receives the alert signal, the display 191 will display to the driver (e.g., a pilot) a visual display alert, which may be a visual alert symbol, color, and/or a textual alert message describing the specific type of erroneous data and/or the specific type of sensor that has failed. In at least one embodiment, after the indicator light 192 receives the alert signal, the indicator light 192 will illuminate and/or change illumination color (e.g., change its color to red) to visually alert the driver (e.g., a pilot) of the vehicle 110.

In addition, when the processor(s) 170 determines that one of the types of data is erroneous, meaning the erroneous data's associated sensor has failed, the processor(s) 170 generates a synthetic data signal indicating to use synthetic data instead of the erroneous sensed data. After the processor (s) 170 has generated the synthetic data signal, the processor (s) 170 transmits the synthetic data signal via wire 197 (or wirelessly) to the flight control system 195. Once the flight control system 195 receives the synthetic data signal, the flight control system 195 will utilize the synthetic data instead of the erroneous sensed data for its flight computations.

Figure 2A:
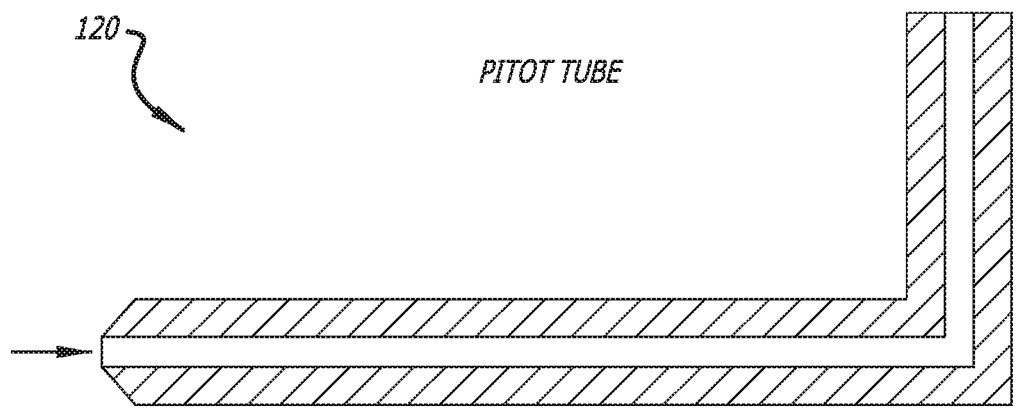
FIG. 2A is a diagram showing an exemplary pitot tube that may be employed for one of the sensors of the disclosed system for sensor fault detection and identification for a vehicle, in accordance with at least one embodiment of the present disclosure.

FIG. 2A is a diagram 200 showing an exemplary pitot tube 120 that may be employed for one of the sensors of the disclosed system for sensor fault detection and identification for a vehicle 110, in accordance with at least one embodiment of the present disclosure. In this figure, an example pitot tube 120 is shown. The pitot tube 120 in FIG. 2A is shown to have one opening on its end. Pitot pressure is obtained from the pitot tube 120. The pitot pressure is a measure of ram air pressure (i.e. the air pressure created by vehicle motion or the air ramming into the tube), which under ideal conditions is equal to stagnation pressure (also referred to as total pressure ($P_T$)). The pitot tube 120 may be employed by the disclosed system to obtain total pressure ($P_T$).

The pitot tube 120 is most often located on the wing or front section of an aircraft facing forward, where its opening is exposed to the relative wind. By situating the pitot tube 120 in such a location, the ram air pressure is more accurately measured since it will be less distorted by the aircraft's structure. When airspeed increases, the ram air pressure is increased, which can be translated by the airspeed indicator.

Figure 2B:
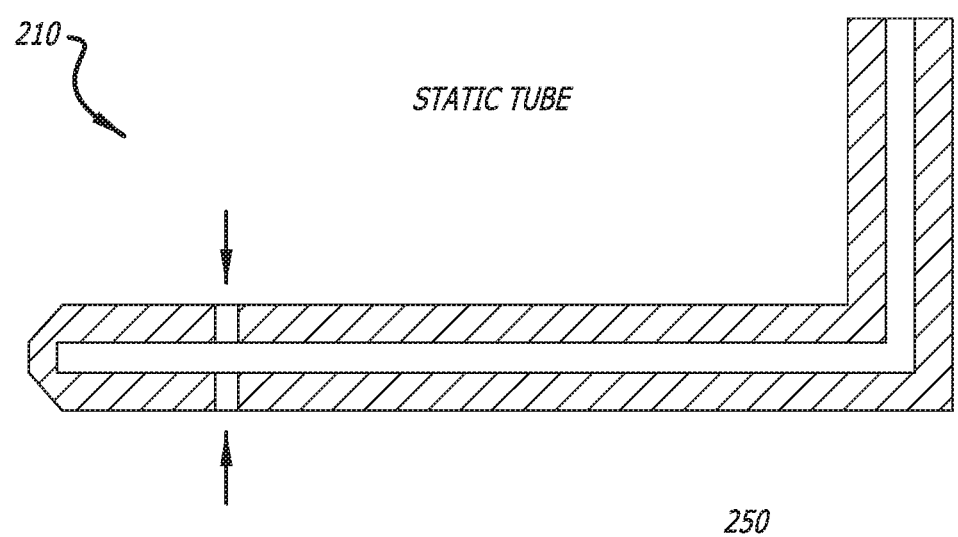
FIG. 2B is a diagram showing an exemplary static tube that may be employed for one of the sensors of the disclosed system for sensor fault detection and identification for a vehicle, in accordance with at least one embodiment of the present disclosure.

FIG. 2B is a diagram 250 showing an exemplary static tube 210 that may be employed for one of the sensors of the disclosed system for sensor fault detection and identification for a vehicle 110, in accordance with at least one embodiment of the present disclosure. In this figure, an example static tube 210 is shown. The static tube 210 of FIG. 2B is shown to have two openings, which are located on the top side and bottom side of the static tube 210. The static tube 210 obtains static pressure ($P_S$) similar to a static port 130 (refer to FIG. 1A). The static tube 210 and/or the static port 130 may be employed by the disclosed system to obtain static pressure ($P_S$).

A static port 130 (refer to FIG. 1A) is most often a flush-mounted hole on the fuselage of an aircraft, and is located where it can access the air flow in a relatively undisturbed area. Some aircraft may have a single static port, while others may have more than one. In situations where an aircraft has more than one static port 130, there is usually one located on each side of the fuselage. With this positioning, an average pressure can be taken, which allows for more accurate readings in specific flight situations. An alternative static port 130 may be located inside the cabin of the aircraft as a backup for when the external static port(s) 130 are blocked.

FIG. 2C is a diagram 230 showing an exemplary pitot-static tube 220 that may be employed for one of the sensors of the disclosed system for sensor fault detection and identification for a vehicle 110, in accordance with at least one embodiment of the present disclosure. In this figure, an example pitot-static tube 220 is shown. The pitot-static tube 220 of FIG. 2C is shown to have three openings, which are located on the end of the pitot-static tube 220, and on the top side and bottom side of the pitot-static tube 220. A pitot-static tube 220 effectively integrates static ports into a pitot probe. It also incorporates a second coaxial tube (or tubes) with pressure sampling holes on the sides of the probe, outside the direct airflow, to measure the static pressure ($P_S$). When the aircraft climbs, the static pressure ($P_S$) will decrease. A pressure transducer 240 is used to measure the difference in total pressure ($P_T$) and static pressure ($P_S$). The pitot-static tube 220 may be employed by the disclosed system to obtain total pressure ($P_T$) and static pressure ($P_S$).

Figure 3:
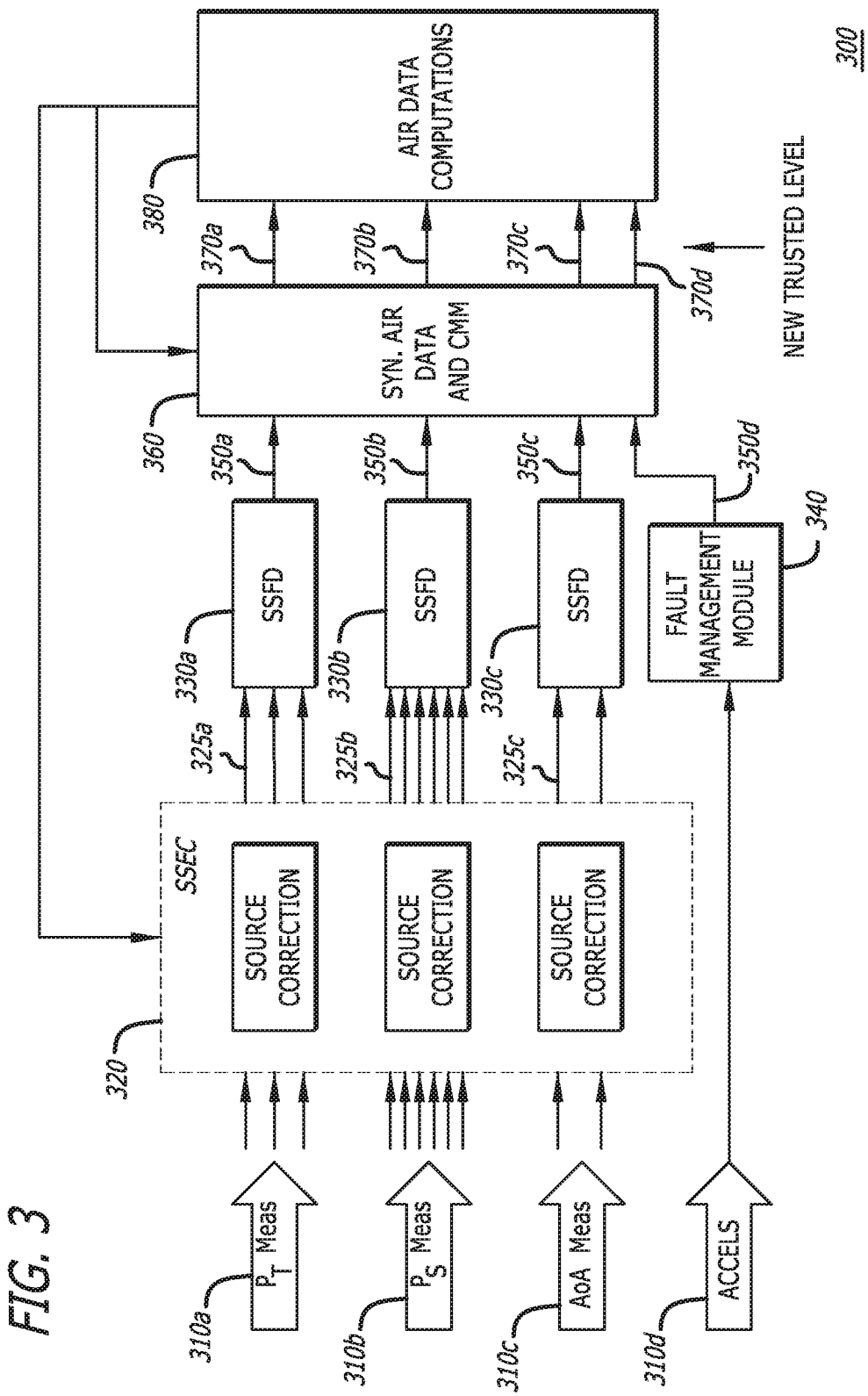
FIG. 3 is a block diagram showing the disclosed system for sensor fault detection and identification for a vehicle, in accordance with at least one embodiment of the present disclosure.

FIG. 3 is a block diagram 300 showing the disclosed system for sensor fault detection and identification for a vehicle 110, in accordance with at least one embodiment of the present disclosure. In this figure, data (i.e. sensor measurements) sensed by the different types of sensors located on the vehicle are shown. In particular, total pressure ($P_T$) data 310a sensed by the pitot tubes 120, static pressure ($P_S$) data 310b sensed by the static port 130, angle of attack (AOA) ($\alpha$) data 310c sensed by the AOA resolvers 140, and acceleration ($A_N$) data 310d sensed by the accelerometer 150 are shown.

It should be noted that some of the sensed data comprises data sensed from multiple sensors. For example, the total pressure ($P_T$) data 310a comprises data sensed by three separate pitot tubes 120 located on the vehicle (e.g., airplane) 110. In FIG. 3, three arrows are shown to be outputted from the total pressure ($P_T$) data 310a arrow to represent these three pieces of sensed data.

During operation, the sensed data for the total pressure ($P_T$) data 310a, static pressure ($P_S$) data 310b, and angle of attack (AOA) ($\alpha$) data 310c are inputted into a static source error correction (SSEC) module 320. It should be noted that the SSEC module 320 may be implemented within and/or executed by at least one processor 170 on the vehicle 110. The SSEC module 320 performs source correction on the sensed data 310a, 310b, 310c by removing known corruption effects from the sensed data 310a, 310b, 310c to generate clean data measurements 325a, 325b, 325c. The SSEC module 320 removes the known corruption effects from the sensed data 310a, 310b, 310c by utilizing other data measurements including, but not limited to, dynamic pressure, Mach number, angle of attack (ADA), flap position, gear position, excess thrust, and/or ground effect terms.

Once the known corruption effects from the sensed data 310a, 310b, 310c have been removed, the clean data measurements 325a, 325b, 325c are inputted into source selection fault detection (SSFD) modules 330a, 330b, 330c. The SSFD modules 330a, 330b, 330c may be implemented within and/or executed by at least one processor 170 on the vehicle 110. Each SSFD module 330a, 330b, 330c performs majority voting on the inputted clean data measurements 325a, 325b, 325c to generate a single voted value 350a, 350b, 350c. For example, SSFD module 330a performs majority voting on three clean data measurements 325a to generate a single voted value 350a.

Also, during operation, the acceleration ($A_N$) data 310d is inputted into a fault management module 340. The fault management module 340 may be implemented within and/or executed by at least one processor 170 on the vehicle 110. The fault management module 340 performs majority voting on the acceleration ($A_N$) data 310d to generate a single voted value 350d.

It should be noted that, in one or more embodiments, various different types of majority voting algorithms (e.g., the Boyer-Moore majority voting algorithm) may be utilized by the SSFD modules 330a, 330b, 330c and the fault management module 340 to perform the majority voting.

After all of the single voted values 350a, 350b, 350c, 350d have been generated, the single voted values 350a, 350b, 350c, 350d are inputted into a synthetic air data and common mode monitor (CMM) 360. The synthetic air data and CMM 360 may be implemented within and/or executed by at least one processor 170 on the vehicle 110. The synthetic air data and CMM 360 utilizes the single voted values 350a, 350b, 350c, 350d to generate trusted values 370a, 370b, 370c, 370d to be used (e.g., to be used by the flight control system) for operation of the vehicle 110. In particular, the synthetic air data and CMM 360 utilizes the single voted values 350a, 350b, 350c, 350d to generate a total pressure ($P_T$) trusted value 370a, a total pressure ($P_S$) trusted value 370b, an AOA trusted value 370c, and an acceleration trusted value 370d. Details of the operation of the synthetic air data and CMM 360 will be described in the description of FIGS. 4, 5, 8, 9, and 10.

Referring back to FIG. 3, after the trusted values 370a, 370b, 370c, 370d have been generated by the synthetic air data and CMM 360, the trusted values 370a, 370b, 370c, 370d are inputted into an air data computations module 380. The air data computations module 380 may be implemented within and/or executed by at least one processor 170 (which may be part of the flight control system) on the vehicle 110. The air data computations module 380 may utilize the trusted values 370a, 370b, 370c, 370d for making calculations needed for the operation (e.g., flight) of the vehicle (e.g., airplane) 110.

Figure 4:
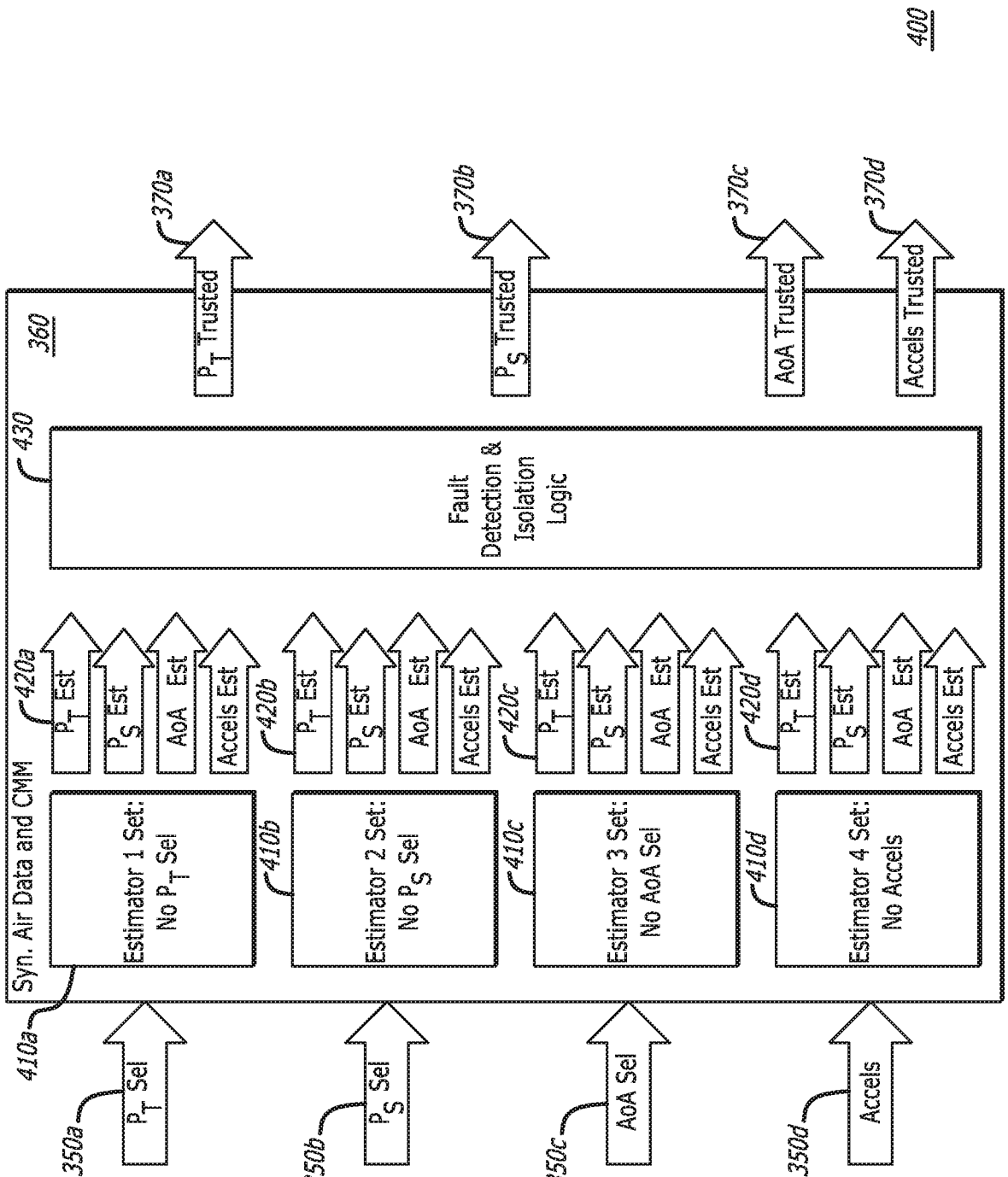
FIG. 4 is a block diagram showing details of the functionality of the synthetic air data and common mode monitor (CMM) of FIG. 3, in accordance with at least one embodiment of the present disclosure.

FIG. 4 is a block diagram 400 showing details of the functionality of the synthetic air data and common mode monitor (CMM) 360 of FIG. 3, in accordance with at least one embodiment of the present disclosure. In this figure, the single voted values 350a, 350b, 350c, 350d are inputted into the synthetic air data and CMM 360. In particular, the voted value for total pressure ($P_T$) 350a, the voted value for static pressure ($P_S$) 350b, the voted value for AOA 350c, and the voted value for acceleration 350d are inputted into the synthetic air data and CMM 360.

After the synthetic air data and CMM 360 has received the single voted values 350a, 350b, 350c, 350d, an estimator 410a, 410b, 410c, 410d for each of the types of data generates estimated values (e.g., synthetic values) 420a, 420b, 420c, 420d using some of the single voted values 350a, 350b, 350c, 350d. In particular, each estimator 410a, 410b, 410c, 410d, for a type of data uses the single voted values 350a, 350b, 350c, 350d for the other types of data to generate estimated values 420a, 420b, 420c, 420d for all of the types of data.

The estimators 410a, 410b, 410c, 410d use statistical filters to generate the estimated values 420a, 420b, 420c, 420d. Various different types of statistical filters may be used by the estimators 410a, 410b, 410c, 410d to generate the estimated values 420a, 420b, 420c, 420d including, but not limited to, Kalman filters, extended Kalman filters (EKFs), unscented Kalman filters, frequency-weighted Kalman filters, fixed-lag smoothers, fixed-interval smoothers (e.g., Rauch-Tung-Striebel smoothers, modified Bryson-Frazier smoothers, and minimum-variance smoothers), Kalman-Bucy filters, and hybrid Kalman filters.

For example, estimator 1 410a for the total pressure (PT) data type, utilizes the voted value for static pressure ($P_S$) 350b, the voted value for AOA 350c, and the voted value for acceleration 350d to generate the estimated values 420a (which include an estimated value for total pressure (PT), an estimated value for static pressure ($P_S$), an estimated value for AOA, and an estimated value for acceleration). Also, estimator 2 410b for the static pressure ($P_S$) data type, utilizes the voted value for total pressure ($P_T$) 350a, the voted value for AOA 350c, and the voted value for acceleration 350d to generate the estimated values 420b (which include an estimated value for total pressure (PT), an estimated value for static pressure ($P_S$), an estimated value for AOA, and an estimated value for acceleration). In addition, estimator 3 410c for the AOA data type, utilizes the voted value for total pressure ($P_T$) 350a, the voted value for static pressure ($P_S$) 350b, and the voted value for acceleration 350d to generate the estimated values 420c (which include an estimated value for total pressure ($P_T$), an estimated value for static pressure ($P_S$), an estimated value for AOA, and an estimated value for acceleration). And, estimator 4 410d for the acceleration data type, utilizes the voted value for total pressure ($P_T$) 350a, the voted value for static pressure ($P_S$) 350b, and the voted value for AOA 350c to generate the estimated values 420d (which include an estimated value for total pressure (PT), an estimated value for static pressure ($P_S$), an estimated value for AOA, and an estimated value for acceleration).

After the estimators 410a, 410b, 410c, 410d have each generated estimated values 420a, 420b, 420c, 420d, the estimated values 420a, 420b, 420c, 420d are inputted into a fault detection and isolation logic module 430. The fault detection and isolation logic module 430 generates residuals ($r_1, r_2, r_3, r_4$) by comparing the estimated values 420a, 420b, 420c, 420d to the voted values 350a, 350b, 350c, 350d. Details of how the residuals are generated are described in the description of FIG. 9. After the residuals ($r_1, r_2, r_3, r_4$) are generated, the fault detection and isolation logic module 430 analyzes a pattern of the residuals ($r_1, r_2, r_3, r_4$) to determine which (if any) type of the data is erroneous. An exemplary fault detection logic (i.e. logic for detecting an erroneous type of data) is shown in FIG. 8, and an exemplary expected pattern of residuals is shown in FIG. 10.

After the fault detection and isolation logic module 430 has analyzed the pattern of residuals ($r_1, r_2, r_3, r_4$), if the fault detection and isolation logic module 430 determines that there is no erroneous data, the fault detection and isolation logic module 430 will simply output the voted values 350a, 350b, 350c, 350d to be used for the trusted values 370a, 370b, 370c, 370d (e.g., total pressure ($P_T$) trusted value 370a, total pressure ($P_S$) trusted value 370b, AOA trusted value 370c, and acceleration trusted value 370d).

However, if the fault detection and isolation logic module 430 determines that a type of data (e.g., total pressure ($P_T$)) is erroneous, the fault detection and isolation logic module 430 will output the voted values 350b, 350c, 350d for the other types of data to be used for the trusted values 370b, 370c, 370d (e.g., total pressure ($P_S$) trusted value 370b, AOA trusted value 370c, and acceleration trusted value 370d) for those other types of data. And, the fault detection and isolation logic module 430 will output the estimated value (synthetic data) 420a generated by the data type's associated estimator (e.g., estimator 1) 420a for that erroneous data type (e.g., total pressure ($P_T$)) to be used for the trusted value 370a (e.g., total pressure ($P_T$) trusted value) for that erroneous data type.

FIG. 5 shows equations for generating the estimated values utilized by the disclosed system for sensor fault detection and identification for a vehicle 110, in accordance with at least one embodiment of the present disclosure. For these equations, x is a vector representing the underlying state for the data types, and y is a vector representing the voted values 350a, 350b, 350c, 350d for the data types. Also, each ŷ is a vector representing the estimated values 420a, 420b, 420c, 420d generated by each of the estimators 410a, 410b, 410c, 410d. In particular, for these equations, $\hat{y}_1$ is the estimated values generated by estimator 1 410a, $\hat{y}_2$ is the estimated values generated by estimator 2 410b, $\hat{y}_3$ is the estimated values generated by estimator 3 410c, and $\hat{y}_4$ is the estimated values generated by estimator 4 410d. Also, for these equations, f (e.g., $f_1$, $f_2$, $f_3$, and $f_4$) represents the statistical filter (e.g., extended Kalman filter (EKF)) used to generate the estimated values 420a, 420b, 420c, 420d. And, the variables (e.g., $P_T$, $P_S$, α, $A_N$) within the parenthesis represent the voted values 350a, 350b, 350c, 350d used to generate the estimated values 420a, 420b, 420c, 420d.

For example, for estimator 1 410a (which is associated with the total pressure ($P_T$) data type), the voted value for static pressure ($P_S$) 350b, the voted value for AOA (α) 350c, and the voted value for acceleration 350d are used by the statistical filter ($f_1$) (e.g., EKF) to generate the estimated values 420a. As such, when there are m number of different data types sensed, each estimator 410a, 410b, 410c, 410d will use n number (which is equal to m minus 1 (n=m-1)) of voted values 350a, 350b, 350c, 350d to generate the estimated values 420a, 420b, 420c, 420d.

Figure 6A:
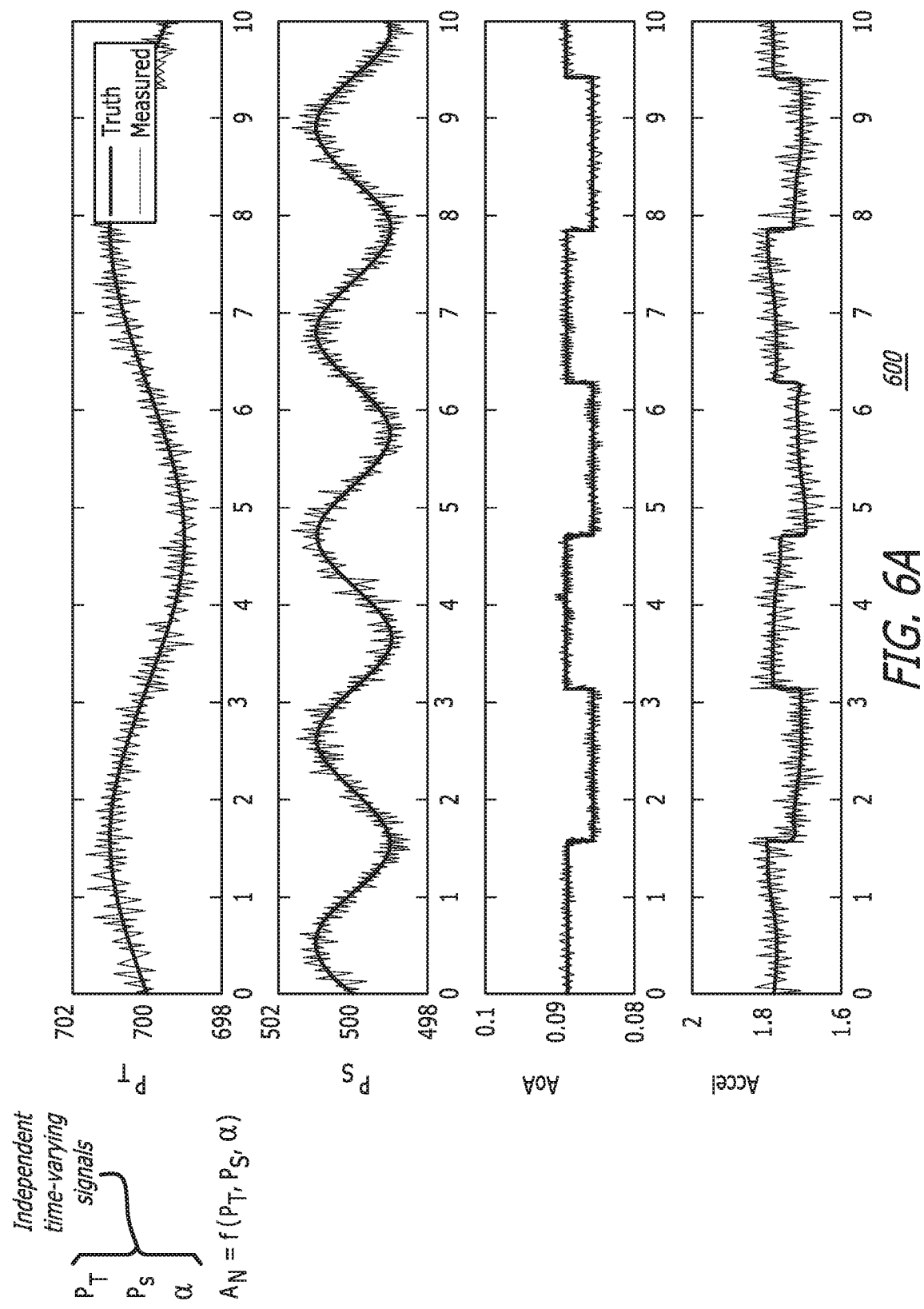
FIG. 6A shows exemplary graphs illustrating the sensed data (i.e. measured data) and the corresponding real values (i.e. truth values) for four different types of sensor data, where none of the sensed data is erroneous, in accordance with at least one embodiment of the present disclosure.

FIG. 6A shows exemplary graphs 600 illustrating the sensed data (i.e. measured data) 310a, 310b, 310c, 310d and the corresponding real values (i.e. truth values) for four different types of sensor data, where none of the sensed data 310a, 310b, 310c, 310d is erroneous, in accordance with at least one embodiment of the present disclosure. Each graph of this figure shows a different type of sensed data (e.g., total pressure ($P_T$), static pressure ($P_S$), AOA, and acceleration). As is shown in this figure, the sensed data (i.e. measured values) 310a, 310b, 310c, 310d closely follow the real values (i.e. truth values) for that data and, as such, no type of data is erroneous.

Figure 6B:
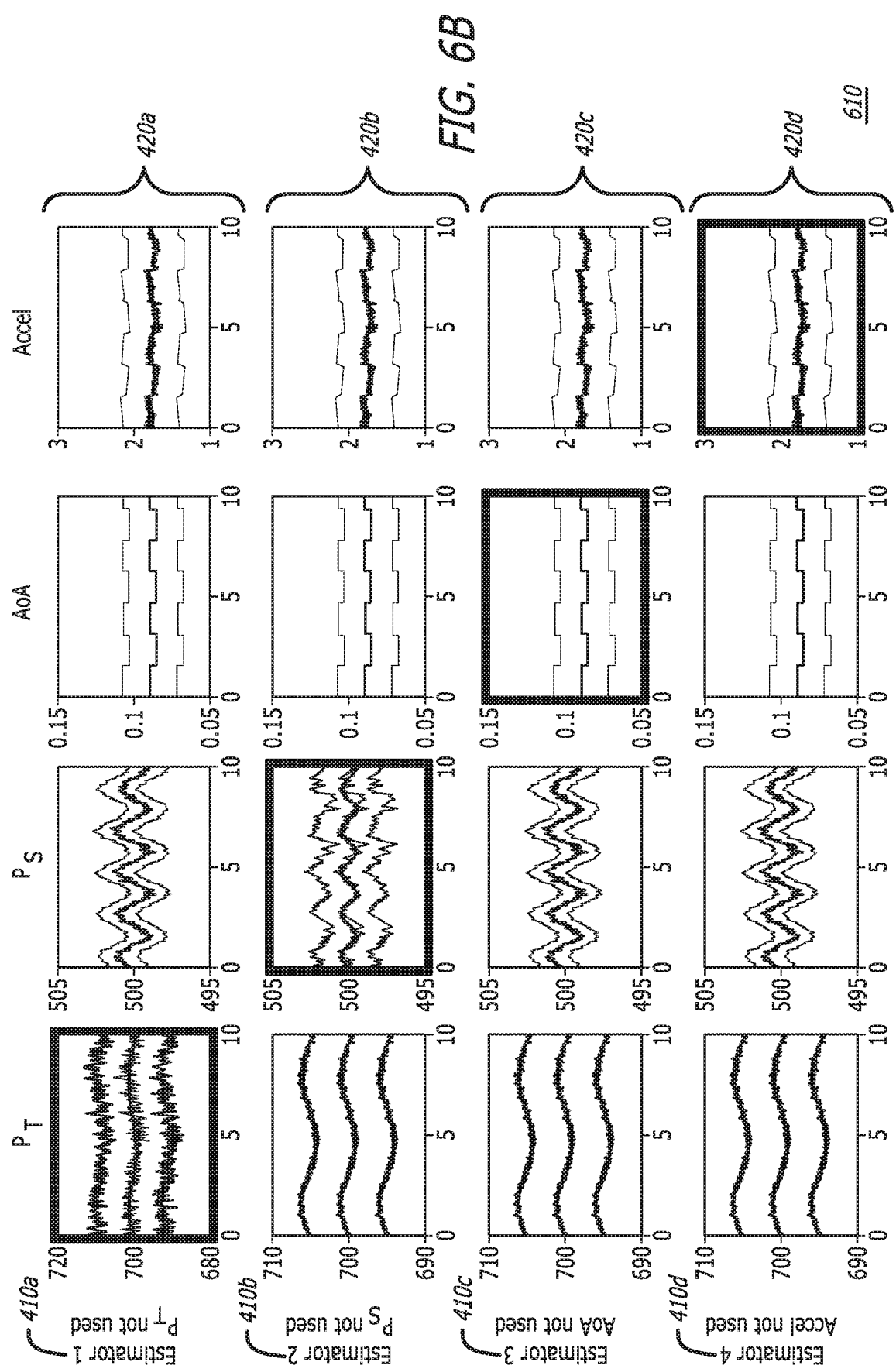
FIG. 6B shows exemplary graphs illustrating the estimated values (i.e. synthetic values) generated by the disclosed system for sensor fault detection and identification for a vehicle, where none of the sensed data is erroneous, in accordance with at least one embodiment of the present disclosure.

FIG. 6B shows exemplary graphs 610 illustrating the estimated values (i.e. synthetic values) 420a, 420b, 420c, 420d generated by the disclosed system for sensor fault detection and identification for a vehicle 110, where none of the sensed data 310a, 310b, 310c, 310d is erroneous, in accordance with at least one embodiment of the present disclosure. In this figure, each row of graphs illustrates the estimated values 420a, 420b, 420c, 420d generated by one of the estimators 410a, 410b, 410c, 410d. For example, the first row of graphs shows the estimated values 420a generated by estimator 1 410a, the second row of graphs shows the estimated values 420b generated by estimator 2 410b, the third row of graphs shows the estimated values 420c generated by estimator 3 410c, and the fourth row of graphs shows the estimated values 420d generated by estimator 4 410d.

In FIG. 6B, each of the sixteen graphs shows four lines of data, one of the middle lines of data of each graph is the generated estimated value 420a, 420b, 420c, 420d for the data type of the graph. The other middle lines of data of each graph are the sensed data (i.e. measured values) 310a, 310b, 310c, 310d. The upper and lower lines of data of each graph denote an upper and lower threshold (T) for the estimated data (e.g., estimated values) 420a, 420b, 420c, 420d to lie within.

Figure 7A:
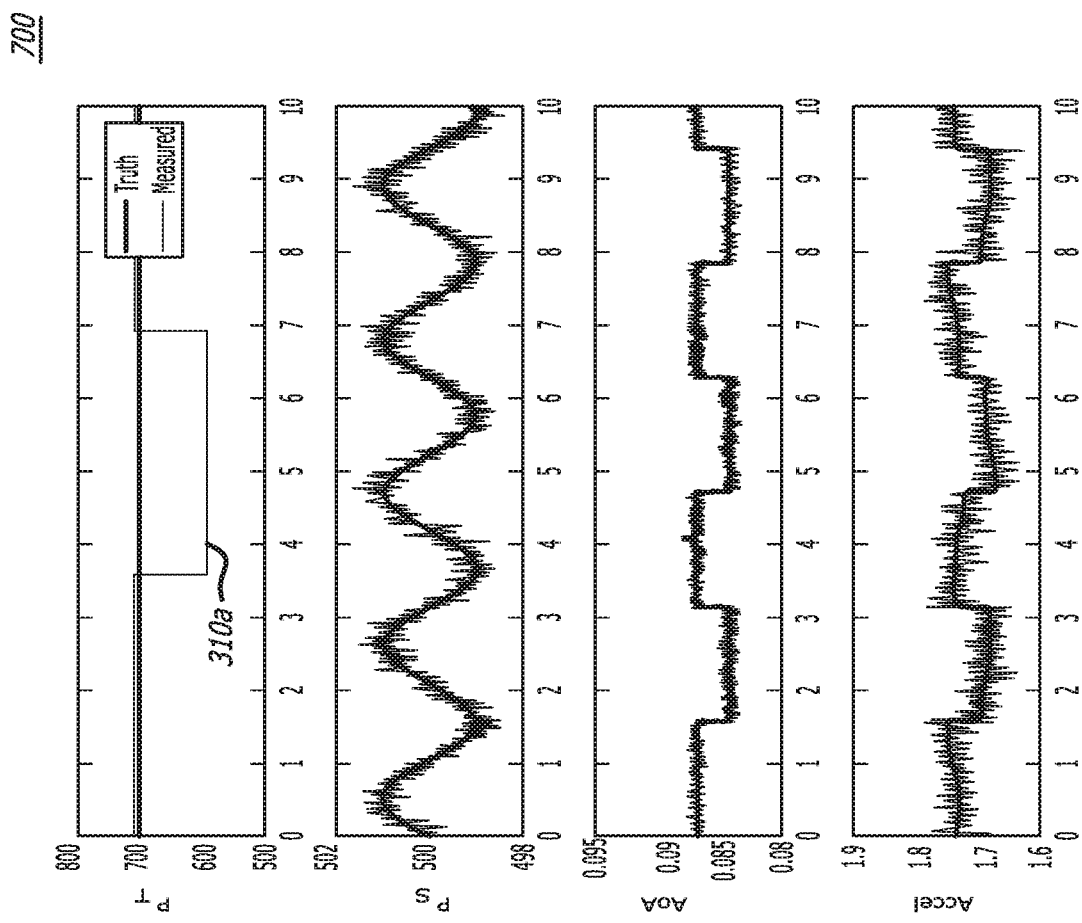
FIG. 7A shows exemplary graphs illustrating the sensed data (i.e. measured data) and the corresponding real values (i.e. truth values) for four different types of sensor data, where one of the types of sensed data (i.e. total pressure ($P_T$)) is erroneous, in accordance with at least one embodiment of the present disclosure.

FIG. 7A shows exemplary graphs illustrating the sensed data (i.e. measured data) 310a, 310b, 310c, 310d and the corresponding real values (i.e. truth values) for four different types of sensor data, where one of the types of sensed data (i.e. total pressure ($P_T$)) 310a is erroneous, in accordance with at least one embodiment of the present disclosure. Each graph of this figure shows a different type of sensed data (e.g., total pressure ($P_T$), static pressure ($P_S$), AOA, and acceleration). As is shown in this figure, the sensed data (i.e. measured values) for static pressure ($P_S$), AOA, and acceleration 310b, 310c, 310d, closely follow the real values (i.e. truth values) for that data. However, the sensed data (i.e. measured values) for total pressure ($P_T$) 310a does not closely follow the real values (i.e. truth values) for that data type and, thus, the sensed data for total pressure ($P_T$) 310a is erroneous. As such, it can be inferred that the pitot tubes 120, which sense the total pressure ($P_T$), are experiencing a failure (e.g., a CMPE).

Figure 7B:
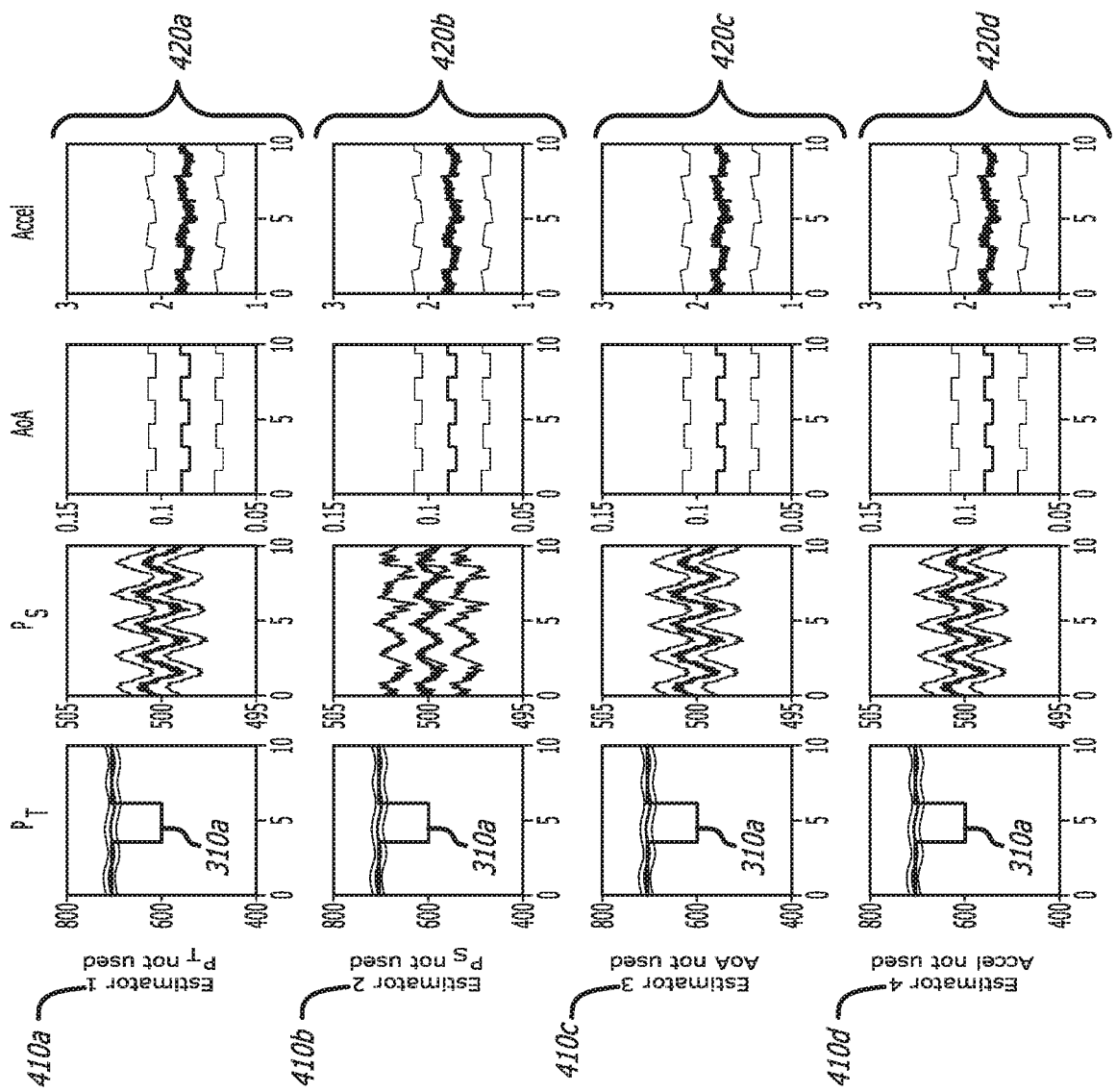
FIG. 7B shows exemplary graphs illustrating the estimated values (i.e. synthetic values) generated by the disclosed system for sensor fault detection and identification for a vehicle, where one of the types of sensed data (i.e. total pressure ($P_T$)) is erroneous, in accordance with at least one embodiment of the present disclosure.

FIG. 7B shows exemplary graphs illustrating the estimated values (i.e. synthetic values) 420a, 420b, 420c, 420d generated by the disclosed system for sensor fault detection and identification for a vehicle 110, where one of the types of sensed data (i.e. total pressure ($P_T$)) 310a is erroneous, in accordance with at least one embodiment of the present disclosure. In this figure, each row of graphs illustrates the estimated values 420a, 420b, 420c, 420d generated by one of the estimators 410a, 410b, 410c, 410d. For example, the first row of graphs shows the estimated values 420a generated by estimator 1 410a, the second row of graphs shows the estimated values 420b generated by estimator 2 410b, the third row of graphs shows the estimated values 420c generated by estimator 3 410c, and the fourth row of graphs shows the estimated values 420d generated by estimator 4 410d.

In FIG. 7B, each of the sixteen graphs shows four lines of data, one of the middle lines of data of each graph is the generated estimated value 420a, 420b, 420c, 420d for the data type of the graph. The other middle lines of data of each graph are the sensed data (i.e. measured values) 310a, 310b, 310c, 310d. The upper and lower lines of data of each graph denote an upper and lower threshold (T) for the estimated value (e.g., estimated data) 420a, 420b, 420c, 420d to lie within.

In this figure, the graphs for the total pressure ($P_T$) data type (refer to the first column of graphs) exhibit that the sensed total pressure ($P_T$) 310a lies outside of the lower threshold (T). It should be noted that since the sensed data for total pressure ($P_T$) 310a is erroneous, the estimated value 420a generated by estimator 1 420a will be used as the trusted value for total pressure ($P_T$) 470a.

FIG. 8 shows equations for the fault detection logic utilized by the disclosed system for sensor fault detection and identification for a vehicle 110, in accordance with at least one embodiment of the present disclosure. In this figure, the fault detection logic states that a sensed data type is erroneous (i.e. and the associated type of sensor has failed) if and only if (IFF): (1) the residuals produced from the estimator associated with that data type are small, and (2) the residuals produced from the estimators associated with the other data types are large. For example, the sensed data for total pressure ($P_T$) 310a is erroneous (i.e. and the pitot tubes 120 have failed), if and only if: (1) the residuals ($r_1$) produced from estimator 1 410a are small (i.e. $|r_{1,Ps}|<T$ and $|r_{1,\alpha}|<T$ and $|r_{2,AN}|<T$), and the residuals produced from estimator 2 410b, estimator 3 410c, and estimator 4 410d are large (i.e. $|r_{2,PT}|\geq T$ and $|r_{3,PT}|\geq T$ and $|r_{4,PT}|\geq T$). It should be noted that T represents a predetermined threshold. Also, it should be noted that, in one or more embodiments, the different threshold T values may be used for the different residuals.

Also, it should be noted that the residuals produced from estimator 1 410a are small because estimator 1 410a does not utilize the erroneous sensed data for total pressure (PT) 310a to generate its estimated values 420a, which is used to calculate the residuals ($r_1$). And, the residuals produced from estimator 2 410b, estimator 3 410c, and estimator 4 410d are large because these estimators 410b, 410c, 410d utilize the erroneous sensed data for total pressure ($P_T$) 310a to generate their estimated values 420b, 420c, 420d, which are used to calculate the residuals ($r_2$, $r_3$, $r_4$).

Figure 9:
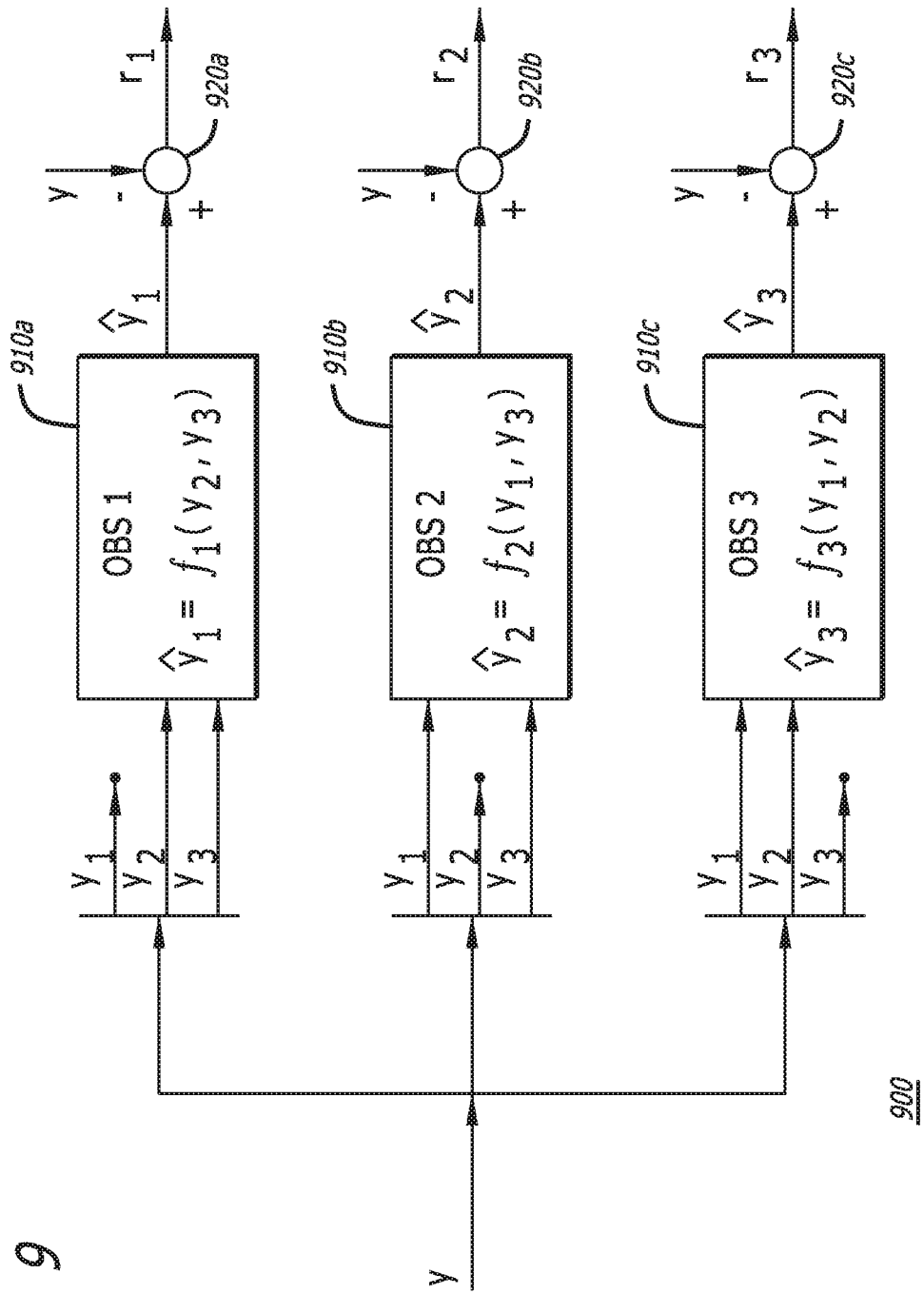
FIG. 9 is a diagram showing how the residuals are generated by the disclosed system for sensor fault detection and identification for a vehicle, in accordance with at least one embodiment of the present disclosure.

FIG. 9 is a diagram 900 showing how the residuals are generated by the disclosed system for sensor fault detection and identification for a vehicle 110, in accordance with at least one embodiment of the present disclosure. It should be noted that the example shown in this figure is using a total of three types of data (e.g., total pressure ($P_T$), static pressure (PS), and AOA). In this figure, each estimator (e.g., observer (OBS) 1, OBS 2, and OBS 3) 910a, 910b, 910c, is using voted values from two of the data types to generate estimated values for all three of the data types.

For example, the first estimator (OBS 1) 910a, which is associated with the total pressure ($P_T$) data type, utilizes static pressure ($P_S$) voted value ($y_2$) and AOA voted value ($y_3$) to generate (by using a statistical filter $f_1$) its estimated value $\hat{y}_1$. Also, the second estimator (OBS 2) 910b, which is associated with the static pressure ($P_S$) data type, utilizes total pressure ($P_T$) voted value ($y_1$) and AOA voted value ($y_3$) to generate (by using a statistical filter $f_2$) its estimated value $\hat{y}_2$. And, the third estimator (OBS 3) 910c, which is associated with the AOA data type, utilizes total pressure ($P_T$) voted value ($y_1$) and static pressure ($P_S$) voted value ($y_2$) to generate (by using a statistical filter $f_3$) its estimated value $\hat{y}_3$.

After the estimated values $\hat{y}_1$, $\hat{y}_2$, $\hat{y}_3$ are generated by the estimators 910a, 910b, 910c, the voted values $y_1$, $y_2$, $y_3$ are subtracted from their respective estimated values $\hat{y}_1$, $\hat{y}_2$, $\hat{y}_3$ to generate the residuals $r_1$, $r_2$, $r_3$. As such, $r_1$ is equal to $\hat{y}_1-y_1$; $r_2$ is equal to $\hat{y}_2-y_2$; and $r_3$ is equal to $\hat{y}_3-y_3$.

FIG. 10 is a chart 1000 showing an exemplary expected pattern of residuals utilized by the disclosed system for sensor fault detection and identification for a vehicle 110, in accordance with at least one embodiment of the present disclosure. Similar to FIG. 9, the example shown in this figure is using a total of three types of data (e.g., total pressure ($P_T$), static pressure (PS), and AOA). In this figure, the first three rows 1010 of the chart 1000 correspond to the first residual $r_1$, the second three rows 1020 of the chart 1000 correspond to the second residual $r_2$, and the last three rows 1030 of the chart 1000 correspond to the third residual $r_3$.

The second column of the chart 1000 ($f_1=f_2=f_3=0$) shows the expected pattern of residuals for when no type of data is erroneous. Since none of the data is erroneous, all of the residuals should be close to zero, as is shown in the second column.

The third column of the chart 1000 ($f_1\neq 0$, $f_2=0$, $f_3=0$) shows the expected pattern of residuals when the sensed data for the first data type (e.g., total pressure ($P_T$)) is erroneous. The residuals $r_2$, $r_3$ (refer to the rows of 1020 and 1030) for the second and third data types will not be close to zero because their associated estimated values $\hat{y}_2$, $\hat{y}_3$ were generated using the voted value $y_1$ for the first data type (e.g., total pressure ($P_T$)).

The fourth column of the chart 1000 ($f_1=0$, $f_2\neq 0$, $f_3=0$) shows the expected pattern of residuals when the sensed data for the second data type (e.g., static pressure ($P_S$)) is erroneous. The residuals $r_1$, $r_3$ (refer to the rows of 1010 and 1030) for the first and third data types will not be close to zero because their associated estimated values $\hat{y}_1$, $\hat{y}_3$ were generated using the voted value $y_2$ for the second data type (e.g., static pressure ($P_S$)).

The fifth column of the chart 1000 ($f_1=0$, $f_2=0$, $f_3\neq 0$) shows the expected pattern of residuals when the sensed data for the third data type (e.g., AOA) is erroneous. The residuals $r_1$, $r_2$ (refer to the rows of 1010 and 1020) for the first and second data types will not be close to zero because their associated estimated values $\hat{y}_1$, $\hat{y}_2$ were generated using the voted value $y_3$ for the third data type (e.g., AOA).

FIGS. 11A and 11B together form a flow chart showing the disclosed method for sensor fault detection and identification for a vehicle, in accordance with at least one embodiment of the present disclosure. At the start 1110 of the method, sensors located on the vehicle sense data (e.g., measurement data) 1120. In one or more embodiments, the data comprises m number types of data, and m is an integer greater than two. Then, at least one processor removes known corruption effects from at least some of the data 1130. At least one processor then performed majority voting on the data for each of the types of data to generate a single voted value for each of the types of data 1140.

Then, at least one processor generates, for each of the types of data, m number of estimated values by using n number of the voted values 1150. In one or more embodiments, n is equal to m minus 1 (i.e. n=m−1). At least one processor then generates residuals by comparing the estimated values to the voted values 1160. Then, at least one processor analyzes a pattern of the residuals to determine which of the types of the data is erroneous to detect and identify a fault experienced by at least one of the sensors on the vehicle 1170.

Then, at least one processor generates an alert signal indicating which of the types of the data is erroneous and/or which type of the sensor are experiencing a failure 1180. A visual alert (e.g., using an indicator light and/or a display) and/or an audible alert (e.g., using a speaker) is then generated based on information contained in the alert signal 1190. Then, a synthetic data signal is generated that indicates to use synthetic data instead of erroneous sensed data 1195. Then, the method ends 1197.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may, be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for sensor fault detection and identification for a vehicle, the method comprising:
obtaining data from sensor measurements performed by sensors located on the vehicle, wherein the data comprises m number types of data, and m is an integer greater than two;
performing, by at least one processor, majority voting on the data for each of the types of data to generate a corresponding single voted value for each of the types of data;
generating, by the at least one processor, for each of the types of data, m number of corresponding estimated values of the respective different m types of data by using n number of the voted values, wherein n is equal to m minus one, and wherein for each of the types of data, the corresponding voted value is not used to generate the corresponding estimated values;
generating, by the at least one processor, residuals by comparing the estimated values to the voted values; and
analyzing, by the at least one processor, a pattern of the residuals to determine which, if any, of the types of the data is erroneous to detect and identify a fault experienced by at least one of the sensors on the vehicle, wherein the determining comprises:
generating, by the at least one processor, a visual and/or audio alert signal if any of the types of data is determined to be erroneous; and
generating a synthetic data signal indicating to use synthetic data instead of erroneous sensed data.

2. The method of claim 1, wherein:
the residuals comprise a separate residual associated with each estimated value; and
the alert signal is generated based on determining, for at least one of the types of data, that the corresponding estimated values are associated with the residuals not exceeding, or less than, first thresholds, and the remaining estimated values are associated with the residuals exceeding, or greater than or equal to, second thresholds.

3. The method of claim 1, wherein the sensors comprise at least two of a pitot tube, a pitot-static tube, a static port, a static tube, an angle of attack (AOA) resolver, or an accelerometer.

4. The method of claim 1, wherein the types of data comprise at least three of total pressure, static pressure, angle of attack (AOA), or acceleration.

5. The method of claim 1, wherein the vehicle is one of an airborne vehicle, a terrestrial vehicle, or a marine vehicle.

6. The method of claim 5, wherein the airborne vehicle is one of an airplane, an unmanned aerial vehicle (UAV), or a helicopter.

7. The method of claim 1, wherein the method further comprises removing, by the at least one processor, known corruption effects from at least some of the data.

8. The method of claim 7, wherein the known corruption effects are removed by the at least one processor by utilizing at least one of dynamic pressure, Mach number, angle of attack (AOA), flap position, gear position, excess thrust, or ground effect terms.

9. The method of claim 1, wherein the at least one processor generates the estimated values by utilizing at least one statistical filter.

10. The method of claim 9, wherein the at least one statistical filter is an extended Kalman filter (EKF).

11. The method of claim 1, wherein:
the residuals comprise a separate residual associated with each estimated value; and
the alert signal is generated based on determining, for at least one of the types of data, that:
for the estimated values corresponding to the types of data other than the at least one of the types of data, the estimated values of the at least one of the types of data are associated with the residuals which exceed, or are greater than or equal to, first thresholds; and
for the estimated values corresponding to the at least one of the types of data, the estimated values of the types of data other than the at least one of the types of data are associated with the residuals which do not exceed, or are less than, second thresholds.

12. A system for sensor fault detection and identification for a vehicle, the system comprising:
sensors, located on the vehicle and configured to perform measurements, wherein the system is configured to obtain data from the measurements,
wherein the data comprises m number types of data, and wherein m is an integer greater than two; and
at least one processor configured to:
perform majority voting on the data for each of the types of data to generate a corresponding single voted value for each of the types of data; and
generate for each of the types of data, m number of corresponding estimated values of the respective different m types of data by using n number of the voted values, wherein n is equal to m minus one;
wherein for each of the types of data, the corresponding voted value is not used to generate the corresponding estimated values,
wherein the at least one processor is configured to generate residuals by comparing the estimated values to the voted values and to analyze a pattern of the residuals to determine which, if any, of the types of the data is erroneous to detect and identify a fault experienced by at least one of the sensors on the vehicle,
wherein the at least one processor is further configured to generate a visual and/or audio alert signal if any of the types of data is determined to be erroneous, and
wherein the at least one processor is further configured to generate a synthetic data signal indicating whether to use synthetic data instead of erroneous sensed data.

13. The system of claim 12, wherein the sensors comprise at least two of a pitot tube, a pitot-static tube, a static port, a static tube, an angle of attack (AOA) resolver, or an accelerometer.

14. The system of claim 12, wherein the types of data comprise at least three of total pressure, static pressure, angle of attack (AOA), or acceleration.

15. The system of claim 12, wherein the at least one processor is further configured to generate the estimated values by utilizing at least one statistical filter.

16. The system of claim 12, wherein:
the residuals comprise a separate residual associated with each estimated value; and
the alert signal is configured to be generated based on determining, for at least one of the types of data, that:
for the estimated values corresponding to the types of data other than the at least one of the types of data, the estimated values of the at least one of the types of data are associated with the residuals which exceed, or are greater than or equal to, first thresholds; and for the estimated values corresponding to the at least one of the types of data, the estimated values of the types of data other than the at least one of the types of data are associated with the residuals which do not exceed, or are less than, second thresholds.

17. The system of claim 12, wherein the system further comprises at least one of:
   at least one indicator light to generate a visual alert based on information contained in the alert signal;
   at least one display to display a visual display alert based on the information contained in the alert signal; or
   at least one speaker to generate an audio alert based on the information contained in the alert signal.

* * * * *

UNITED STATES PATENT AND TRADEMARK OFFICE
CERTIFICATE OF CORRECTION

PATENT NO. : 11,385,632 B2
APPLICATION NO. : 16/230938
DATED : July 12, 2022
INVENTOR(S) : Brian T. Whitehead et al.

Page 1 of 1

It is certified that error appears in the above-identified patent and that said Letters Patent is hereby corrected as shown below:

In the Claims

In Claim 1, Column 15, Lines 6-7, change "wherein the data comprises in number types of data, and in is an integer greater than two;" to --wherein the data comprises m number types of data, and m is an integer greater than two;--

In Claim 1, Column 15, Lines 13-16, change "in number of corresponding estimated values of the respective different in types of data by using n number of the voted values, wherein n is equal to in minus one," to --m number of corresponding estimated values of the respective different m types of data by using n number of the voted values, wherein n is equal to m minus one,--

Signed and Sealed this
Thirtieth Day of August, 2022

Katherine Kelly Vidal
*Director of the United States Patent and Trademark Office*